US007352826B2

(12) United States Patent
Krishnaswami

(10) Patent No.: US 7,352,826 B2
(45) Date of Patent: Apr. 1, 2008

(54) ANALOG DELAY CIRCUIT

(75) Inventor: Anush A. Krishnaswami, Los Angeles, CA (US)

(73) Assignee: Intel Corporation, Santa Clara, CA (US)

( * ) Notice: Subject to any disclaimer, the term of this patent is extended or adjusted under 35 U.S.C. 154(b) by 627 days.

(21) Appl. No.: 10/741,001

(22) Filed: Dec. 19, 2003

(65) Prior Publication Data

US 2005/0134349 A1   Jun. 23, 2005

(51) Int. Cl.
H03K 9/00   (2006.01)
(52) U.S. Cl. .................. 375/316; 327/158; 327/182; 327/183; 327/271; 327/277; 708/301; 708/333; 708/818; 708/819; 340/825.61; 307/409; 324/76.35; 324/76.54
(58) Field of Classification Search ............... 348/571; 327/280, 336; 709/236; 398/58; 375/316; 710/305; 703/25
See application file for complete search history.

(56) References Cited

U.S. PATENT DOCUMENTS

| | | | | |
|---|---|---|---|---|
| 4,694,341 A | * | 9/1987 | Soneda et al. ............... 348/571 |
| 5,384,501 A | * | 1/1995 | Koyama et al. ............. 327/336 |
| 5,461,335 A | * | 10/1995 | Tsuchiya .................... 327/280 |
| 5,560,038 A | * | 9/1996 | Haddock .................... 709/236 |
| 5,594,576 A | * | 1/1997 | Sutherland et al. ........... 398/58 |
| 2002/0122503 A1 | * | 9/2002 | Agazzi ....................... 375/316 |
| 2003/0217215 A1 | * | 11/2003 | Taborek et al. ............. 710/305 |
| 2003/0220781 A1 | * | 11/2003 | Salmonsen et al. ........... 703/25 |

FOREIGN PATENT DOCUMENTS

| EP | 0751653 A2 | * | 1/1997 |
|---|---|---|---|
| TW | 455840 | | 9/2001 |
| WO | 2003058791 A2 | | 7/2003 |

OTHER PUBLICATIONS

Yost, T.A., Herczfeld, A; Rosen, A., "MMIC and Fiber Optic Delay Line Hybrid Transversal Filter," SBMO/IEEE MTT-S IMOC '95 Proceedings, Drexel University, Philadelphia, PA, 1995, pp. 46-51.
English translation of Taiwan Office Action for application No. 093138554 mailed Aug. 24, 2007, 12 pgs.

* cited by examiner

Primary Examiner—David C. Payne
Assistant Examiner—Adolf DSouza
(74) Attorney, Agent, or Firm—Grossman, Tucker, Perreault & Pfleger, PLLC

(57) ABSTRACT

An analog delay circuit to impart a group delay to an analog input signal is described. The analog delay circuit may comprise a capacitor to impart at least a portion of the group delay to the analog output signal and a buffer circuit coupled between the capacitor and an input stage to substantially remove at least a portion of a capacitive load at the input stage.

16 Claims, 5 Drawing Sheets

ANALOG DELAY CIRCUIT

The subject matter disclosed herein relates to U.S. patent application Ser. No. 10/741,039 filed Dec. 19, 2003; U.S. patent application Ser. No. 10/742,119 filed Dec. 19, 2003; U.S. patent application Ser. No. 10/741,029 filed Dec. 19, 2003 and U.S. patent application Ser. No. 10/741,044 filed Dec. 19, 2003.

BACKGROUND

1. Field

The subject matter disclosed herein relates to circuits and systems for processing analog signals.

2. Information

To recover information from a signal received from noisy communication channel, a receiver typically employs filtering and equalization techniques to enable reliable detection of the information. Decreases in the cost of digital circuitry have enabled the cost effective use of adaptive digital filtering and equalization techniques that can optimally "tune" a filter according to the specific characteristics of a noisy communication channel.

FIG. 1 shows a conventional digital filter 10 employing a finite impulse response (FIR) configuration. An analog input signal 12 is received at an analog to digital converter (ADC) 14 to provide a digital signal at discrete sample intervals. The analog input signal 12 may be transmitting encoded symbols representing information in a noisy communication channel. The ADC 14 may sample the analog input signal at discrete sample intervals corresponding with an inter-symbol temporal spacing or fractions thereof. The sampled output of the ADC 14 comprises a digital signal plus noise. On each discrete sample interval, the digital signal from the present discrete sample interval is provided to a multiplication circuit 20 to be scaled by coefficient $c_0$, and signal taps from the two previous discrete sample intervals (i.e., the digital signal delayed by delay circuits 16 and 26) are provided to multiplication circuits 20 to be scaled by coefficients $c_2$ and $c_4$, respectively. The outputs of the three multiplication circuits are then additively combined at a summing circuit 22 as a filtered output signal.

The delay circuits 16 and 26 store and forward digital values to provide digital output signals which are delayed versions of digital input signals. For example, the delay circuits 16 and 26 may comprise single or multi-bit latch circuits to provide digital signal taps on an interval T.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified.

DETAILED DESCRIPTION

Figure 1:
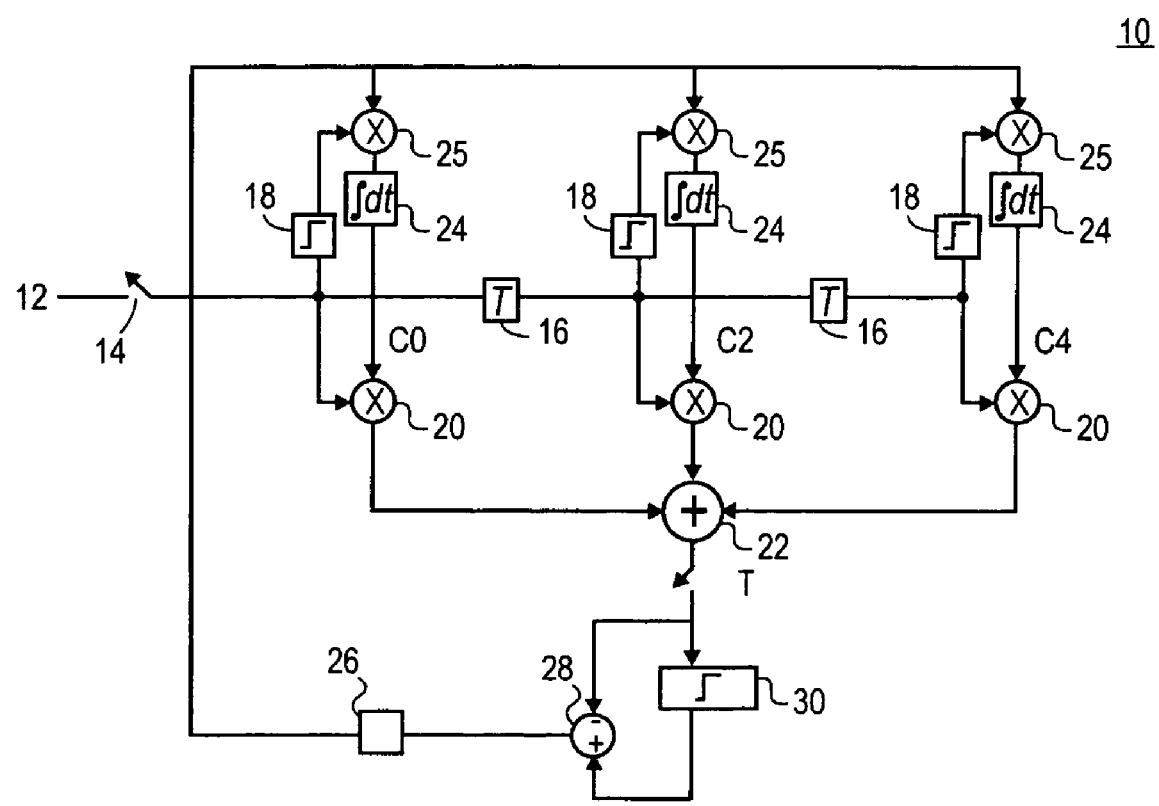
FIG. 1 shows a conventional digital filter employing a finite impulse response (FIR) configuration.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "an embodiment" in various places throughout this specification are not necessarily all referring to the same embodiment. Furthermore, the particular features, structures, or characteristics may be combined in one or more embodiments.

An "analog signal" as referred to herein relates to a signal having a value that may change continuously (and take continuous values) over a time interval. For example, an analog signal may be associated with one or more voltages where each voltage may change continuously over a time interval. An analog signal may be sampled at discrete time intervals to provide a "digital signal" where one or more discrete signal values are associated with each discrete time interval and, unlike an analog signal, do-not-change continuously within such discrete time intervals. However, this is merely an example of an analog signal as contrasted from a digital signal and embodiments of the present invention are not limited in these respects.

A signal may be "tapped" to provide signal taps or delayed versions of a signal to be processed. A "multi-tap filter" as referred to herein relates to circuitry or logic to process a signal by individually processing the signal at distinct signal taps (e.g., at points along a signal path) and combining the individually processed signal taps to provide an equalized signal. For example, a multi-tap filter may comprise one or more delay elements to generate one or more signal taps. An amplitude of each of the signal taps may then be scaled by a corresponding "coefficient." The scaled versions of the signal taps may then be combined to provide an equalized output signal. However, this is merely an example of a multi-tap filter and embodiments of the present invention are not limited in these respects.

A signal tap or delayed version of an input analog signal may be characterized as having a "group delay" identifying a time shift between the input analog signal and the delayed version.

A "buffer circuit" as referred to herein relates to feature of a circuit topology to isolate portions of the circuit topology from one another. For example, a buffer circuit may be coupled between two portions of a circuit topology to match impedances of the two portions. A buffer may also impart a gain to signals transmitted between the two portions of the circuit topology. However, these are merely examples of a buffer circuit and embodiments of the present invention are not limited in these respects.

Briefly, an embodiment of the present invention relates to an analog delay circuit to impart a group delay to an analog input signal. The analog delay circuit my comprise a capacitor to impart at least a portion of the group delay to the analog output signal and a buffer circuit coupled between the capacitor and an input stage to substantially remove at least a portion of a capacitive load at the input stage. However, this is merely an example embodiment and other embodiments are not limited in this respect.

Figure 2:
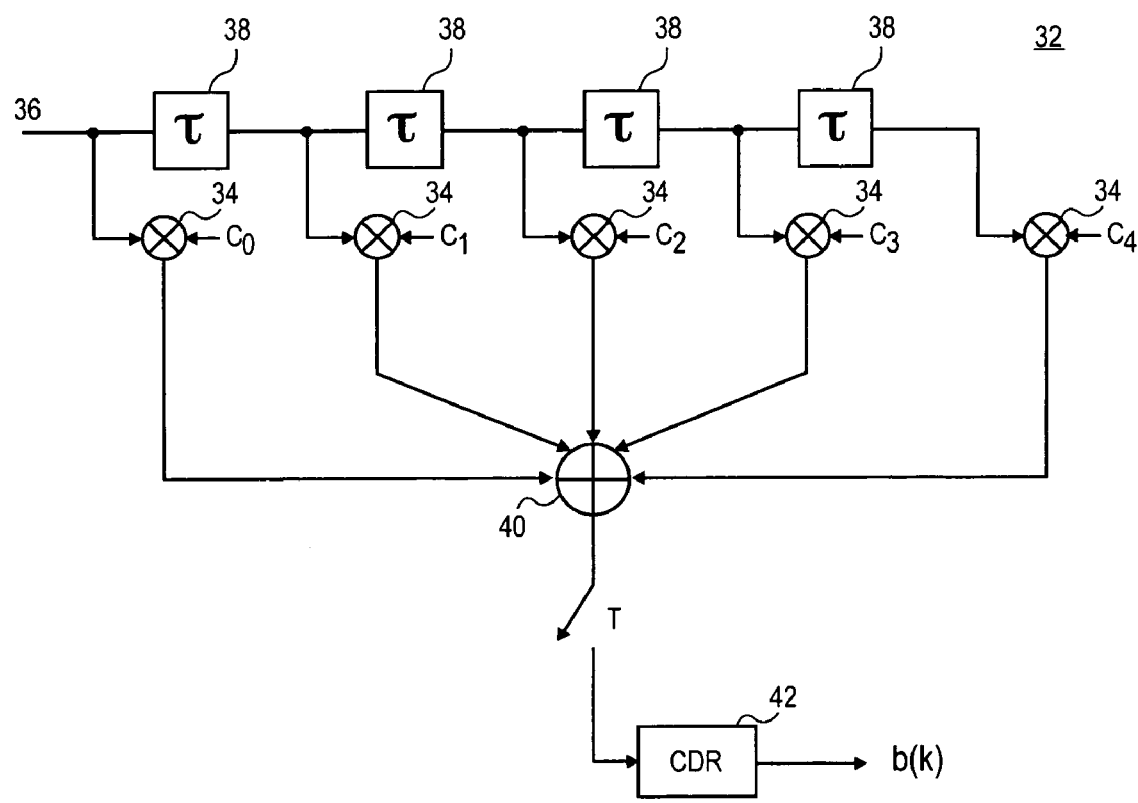
FIG. 2 shows a schematic diagram of a multi-tap filter to process to an analog input signal according to an embodiment of the present invention.

FIG. 2 shows a schematic diagram of a multi-tap filter 32 to process to an analog input signal 36 according to an embodiment of the present invention. In one embodiment, the analog input signal 36 may comprise information encoded in symbols at symbol intervals in the analog input signal 36. Delayed versions or analog signal taps of the analog input signal 36 may be scaled by a corresponding coefficient (e.g., a corresponding one of $c_0$ through $c_4$) at a corresponding multiplication circuit 34, and a summing circuit 40 may additively combine the outputs of the multiplication circuits 34 to generate an equalized analog output signal. The equalized analog input signal may then be sampled at symbol intervals T to enable detection of encoded symbols b(k) at clock and data recover circuit 42.

According to an embodiment, analog signal taps or delayed versions of the analog input signal 36 may be generated by delay circuits 38 at a group delay of $\tau$. The delay circuits 38 may be designed to have a group delay $\tau$ between an analog input signal and an analog signal tap of, for example, a symbol interval or fractions thereof. However, these are merely examples of a group delay that may be imparted to an analog input signal in the form of an analog signal tap and embodiments of the present invention are not limited in these respects.

Figure 3:
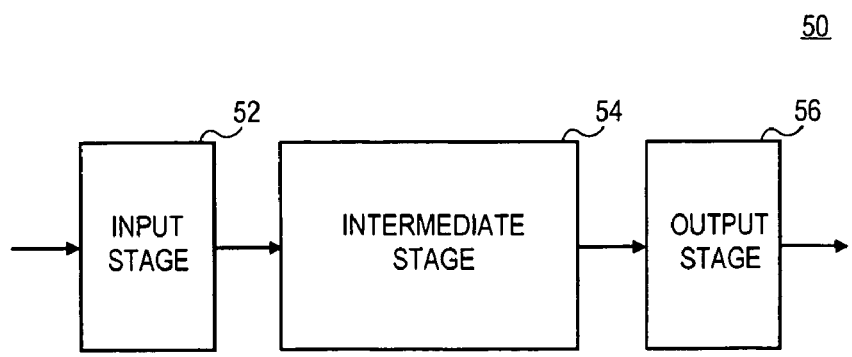
FIG. 3 shows a schematic block diagram of a delay circuit to provide a delayed version of an analog input signal according to an embodiment of the multi-tap as shown in FIG. 2.

FIG. 3 shows a schematic block diagram of a delay circuit 50 to provide an analog signal tap or delayed version of an analog input signal according to an embodiment of a delay circuit 38 in the multi-tap filter 32 shown in FIG. 2. It should be understood, however, that the multi-tap filter 32 merely provides an example of how the delay circuit 50 may be implemented for a specific application and that the delay circuit 50 may be implemented in other applications without departing from the invention. The delay circuit 50 may comprise an input stage 52 to receive an analog input signal and an output stage 56 to provide a delayed version or analog signal tap of the analog input signal at a predetermined group delay. A desired group delay may be selected to provide an appropriately delayed analog signal tap to, for example, a multiplication circuit to be scaled by a corresponding coefficient as illustrated with reference to FIG. 2. According to an embodiment, the input stage 52 and output stage 56 may contribute portions of the total group delay between the analog input signal and the delayed signal tap. An intermediate stage 54 coupled between the input stage 52 and output stage 56 may then introduce a delay in an analog signal received from the input stage 52 to make up the balance of the total delay between the analog input signal received at the input stage 52 and the resulting signal tap provided at the output stage 56.

Figure 4:
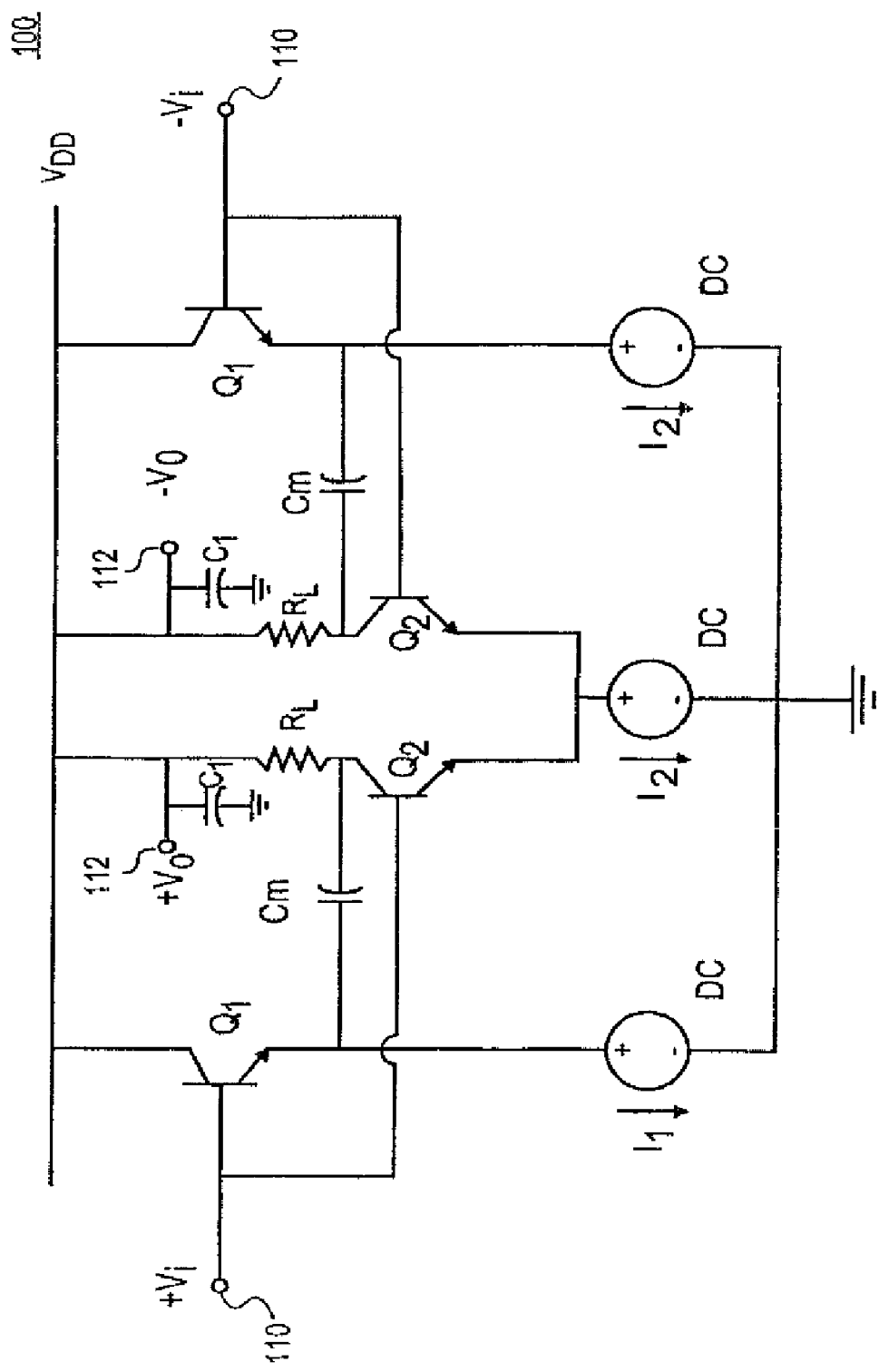
FIG. 4 shows a schematic diagram of an intermediate stage portion of a delay circuit according to an embodiment of the delay circuit shown in FIG. 3.

FIG. 4 shows a schematic diagram of an intermediate stage portion 100 of a delay circuit according to an embodiment of the delay circuit 50 shown in FIG. 3. A differential analog input signal may be received (e.g., from the input stage 52) at differential input terminals 110 and a differential analog output signal may be provided (e.g., to the output stage 56) at differential output terminals 112. Each of the input terminals 110 are coupled to a capacitor $C_m$ through a buffer circuit formed by a corresponding transistor $Q_1$. The capacitor $C_m$ may be formed on a physical semiconductor die. The buffer circuit couples the analog input signal to a differential amplifier formed by transistors $Q_2$ to provide the delayed versions of the differential input signal at output terminals 112.

According to an embodiment, the intermediate stage portion 100 may provide a frequency response H(s) with a zero in a "right half" of a complex plane to enable high data throughput and a large positive group delay. This may result in a negative phase response providing a positive group delay and a high frequency peaking in the amplitude response which may compensate for loss in throughput resulting from poles in the frequency response H(s). The capacitors $C_m$ may be sized to impart a desired group delay to the analog signal at output terminals 112.

In the presently illustrated embodiment, the transistors $Q_1$ may be biased to form the buffer circuits as emitter follower circuits to substantially remove all or a portion of the input capacitive load to an input stage (e.g., input stage 52). The emitter follower circuit may maintain a zero in the right hand portion of the transfer function complex plane. However, this is merely an example of a buffer circuit that may be used to remove all or a portion of a capacitive load and embodiments of the present invention are not limited in this respect.

Assuming negligible base-emitter parasitic capacitance associated with transistors $Q_1$, the transfer function of the intermediate stage 100 may be modeled as follows:

$$H(s) = \frac{C_m(g_{m1} - g_{m2})R_L\left[s - \frac{g_{m1}g_{m2}}{C_m(g_{m1} - g_{m2})}\right]}{s^2 C_m C_L R_L + s[C_m + C_m g_{m1} R_L + C_L R_L g_{m1}] + g_{m1}}$$

where:
$g_{m1}$=transconductance of transistor $Q_1$;
$g_{m2}$=transconductance of transistor $Q_2$;
$R_L$=resistance of load resistors $R_L$;
$C_L$=load capacitance at the output of intermediate stage 100; and
$C_m$=capacitance between an emitter terminal of a transistor Q1 and collector terminal of a corresponding transistor Q2.

Setting $g_{m1} > g_{m2}$ may provide a zero in the right half of the transfer function complex plane. This condition may be caused by setting $I_1 > I_2$ to appropriately bias transistors $Q_1$ and $Q_2$. Assuming $C_L = \sim C_m$ and setting $g_{m1} = 2 \times g_{m2}$, the transfer function H(s) may be reduced to the following:

$$H(s) = \frac{C_m g_{m2} R_L\left(s - \frac{g_{m1}}{C_m}\right)}{\left(s + \frac{2g_{m1}}{C_L}\right)\left(s + \frac{1}{C_L R_L}\right)}$$

Accordingly, the reduced transfer function indicates a pole at $2 g_{m1}/C_L$ which is twice as far from the origin in the complex plane as a zero at $g_{m1}/C_L$. To place the other pole beyond the zero to inhibit interference, $R_L$ may be sized as $R_L < \frac{1}{2} g_{m1}$. The resulting input capacitive load may then be reduced to approximately the sum of base-emitter parasitic capacitances of transistors $Q_1$ and $Q_2$.

Figure 5:
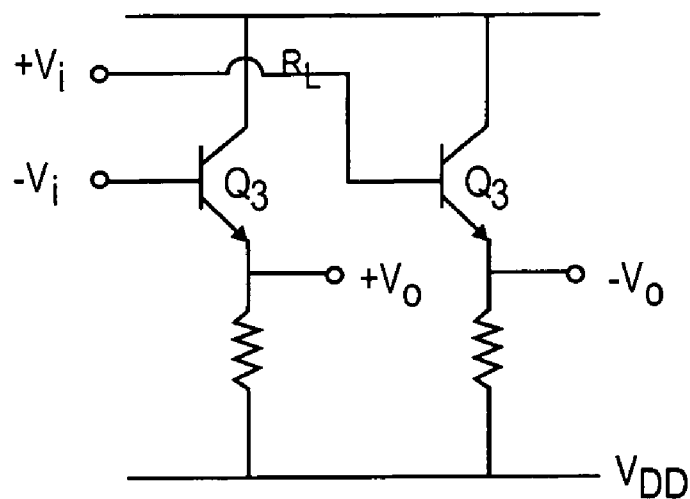
FIG. 5 shows a schematic diagram of an emitter follower circuit according to an embodiment of either the input stage or output stage of a delay circuit according to an embodiment of the delay circuit shown in FIG. 3.

FIG. 5 shows a schematic diagram of an emitter follower circuit 150 according to an embodiment of either an input stage or output stage of a delay circuit according to an embodiment of the delay circuit 50 shown in FIG. 2. An analog differential input signal may be received at base terminals of bipolar transistors $Q_3$ which are biased to provide an emitter follower circuit. Due to parasitic capacitance associated with $Q_3$, the emitter follower circuit 150 (either acting as an input stage or an output stage) may impart a portion of the total group delay of analog delay circuit 50 to an analog output signal. However, these are merely example topologies of either an input stage or output stage of an analog delay circuit, and embodiments of the present invention are not limited in these respects.

Figure 6:
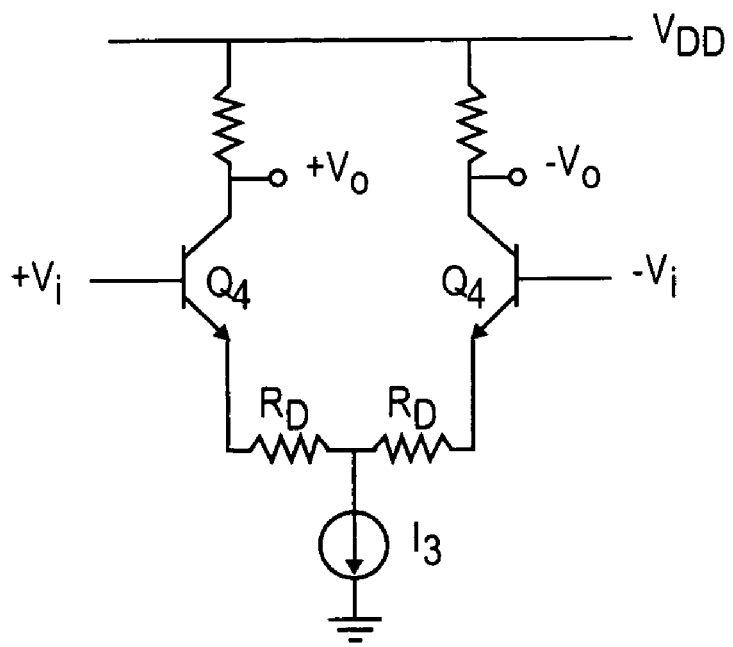
FIG. 6 shows a schematic diagram of a common emitter circuit according to an alternative embodiment of either the input stage or output stage of a delay circuit according to an embodiment of the delay circuit shown in FIG. 3.

FIG. 6 shows a schematic diagram of a differential amplifier circuit 200 according to an alternative embodiment of either the input stage or output stage of the delay circuit according to an embodiment of the delay circuit 50 shown in FIG. 2. An analog differential input signal may be received at base terminals of bipolar transistors $Q_4$ which are biased by a current source $I_3$ to provide a differential amplifier circuit. Degeneration resistors $R_D$ may be coupled between current source $I_3$ and bipolar transistors $Q_4$ to enhance linearity. Due to parasitic capacitance associated with the transistors $Q_4$, the differential amplifier circuit 200 (either acting as an input stage or an output stage) may impart a portion of the total group delay of analog delay circuit 50 to an analog output signal. However, these are merely example topologies of either an input stage or output stage of an analog delay circuit and embodiments of the present invention are not limited in these respects.

Figure 7:
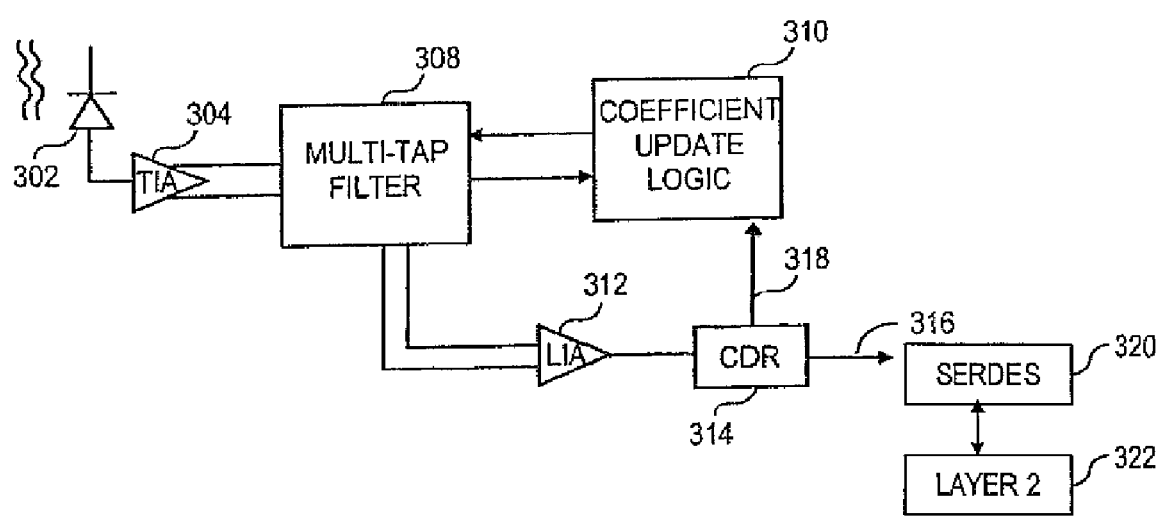
FIG. 7 shows a schematic diagram of an implementation of a multi-tap filter in a receiver according to an embodiment of the multi-tap filter shown in FIG. 2.

According to an embodiment, the multi-tap filter 32 may be implemented as part of a receiver 300 as shown in FIG. 7. A transimpedance amplifier 304 may receive a current signal from a photodiode 302 in response to exposure to light energy (e.g., from a fiber optic cable). The transimpedance amplifier 304 may convert the current signal into an analog input signal expressed as a voltage signal representing the intensity of light energy received at the photodiode 302. A multi-tap filter 308 may process the analog input signal using a multi-tap filter as illustrated above with reference to FIGS. 2 and 3 to provide an equalized analog output signal to a limiting amplifier (LIA) 312. The LIA 312 may then map the equalized analog output signal to specific voltages in a range of voltages. A clock and data recovery (CDR) circuit 314 may associate the mapped voltages with symbols on symbol intervals which are provided at output 316, and generate inter-symbol timing information 318.

According to an embodiment, coefficient update logic 310 may provide periodically updated coefficients to the multi-tap filter 308 based upon estimated errors in the detection of symbols from the equalized analog output signal and the inter-symbol timing information 318. The multi-tap filter 308 provides an equalized analog output signal from an analog input signal without digitally sampling the analog input signal. Accordingly, no analog to digital conversion of the analog input signal is needed prior to filtering at the multi-tap filter. A functional controller (FC) 306 may initialize coefficients in the multi-tap filter 308 and the coefficient update logic 310 at startup.

While the receiver 300 is shown receiving an analog input signal from a photodiode and transimpedance amplifier, it should be understood that the architecture of receiver 300 may be adapted for processing an analog input signal from different transmission media. For example, other embodiments may be adapted for processing an analog input signal received as a differential signaling pair signal over unshielded twisted wire pair cabling or over a device to device interconnection formed in a printed circuit board.

The receiver 300 may be included as part of an optical transceiver (not shown) to transmit or receive optical signals in an optical transmission medium such as fiber optic cabling. The optical transceiver may modulate a transmitted signal or demodulate a received signal 312 according to any optical data transmission format such as, for example, wave division multiplexing wavelength division multiplexing (WDM) or multi-amplitude signaling (MAS). For example, a transmitter portion of the optical transceiver may employ WDM for transmitting multiple "lanes" of data in the optical transmission medium.

The multi-tap filter 308 and LIA 312 may form a physical medium dependent (PMD) section of the receiver 300. Such a PMD section may also provide power from a laser driver circuit (not shown) to a laser device (not shown). The CDR circuit 114 may be included in a physical medium attachment section coupled to the PMD section. Such a PMA section may also include de-multiplexing circuitry (not shown) to recover data from a conditioned signal received from the PMD section, multiplexing circuitry (not shown) for transmitting data to the PMD section in data lanes, and a serializer/deserializer (Serdes) 320 for serializing a parallel data signal from a layer 2 section 322 and providing a parallel data signal to the layer 2 section 322 based upon a serial data signal provided by the CDR circuit 314.

According to an embodiment, the layer 2 section 322 may comprise a media access control (MAC) device coupled to the PMA section at a media independent interface (MII) as defined IEEE Std.802.3ae-2002, clause 46. In other embodiments, the layer 2 section may comprise forward error correction logic and a framer to transmit and receive data according to a version of the Synchronous Optical Network/Synchronous Digital Hierarchy (SONET/SDH) standard published by the International Telecommunications Union (ITU). However, these are merely examples of layer 2 devices that may provide a parallel data signal for transmission on an optical transmission medium, and embodiments of the present invention are not limited in these respects.

The layer 2 section may also be coupled to any of several input/output (I/O) systems (not shown) for communication with other devices on a processing platform. Such an I/O system may include, for example, a multiplexed data bus coupled to a processing system or a multi-port switch fabric. The layer 2 section may also be coupled to a multi-port switch fabric through a packet classification device. However, these are merely examples of an I/O system which may be coupled to a layer 2 device and embodiments of the present invention are not limited in these respects.

While there has been illustrated and described what are presently considered to be example embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Therefore, it is intended that the present invention not be limited to the particular embodiments disclosed, but that the invention include all embodiments falling within the scope of the appended claims.

What is claimed is:

1. An analog delay circuit to impart a group delay in an analog input signal, the analog delay circuit comprising:
    an input stage to receive the analog input signal;
    an output stage to provide the analog output signal substantially comprising a version of the analog input signal delayed according to the group delay; and
    an intermediate stage comprising:
    a capacitor to impart at least a portion of the group delay to the analog output signal; and a buffer circuit coupled between the capacitor and the input stage to substantially remove at least a portion of a capacitive load at an input to the intermediate stage;

a first capacitor coupled to the first differential input terminal through a first buffer circuit;

a second capacitor coupled to the second differential input terminal through a second buffer circuit; and a differential amplifier to provide a differential output signal to the output stage in response to a differential input signal applied to the first and second differential input terminals;

wherein the differential amplifier comprises a first DC current source and wherein the first and second buffer circuits each comprises a second DC current source having a magnitude exceeding a magnitude of first DC current source.

2. The analog delay circuit of claim 1, wherein at least one of the input stage and the output stage comprise a differential amplifier.

3. The analog delay circuit of claim 1, wherein at least one of the input stage and the output stage comprise an emitter follower circuit.

4. The analog delay circuit of claim 1, wherein an input to the intermediate stage comprises first and second differential input terminals.

5. The analog delay circuit of claim 1, wherein each of the first and second buffer circuits comprise an emitter follower circuit.

6. A system comprising:

a receiver adapted to process the analog input signal from a transmission medium, the receiver comprising:

a plurality of delay circuits to generate a plurality of analog signal taps, each delay circuit to generate a corresponding analog signal tap from the analog input signal according to a group delay;

a multi-tap filter to apply each of a plurality of coefficients to a corresponding one of the analog signal taps to provide an equalized analog signal;

a clock and data recovery circuit to recover temporally spaced symbols from the equalized analog signal as a serial data signal; and a deserializer to provide a parallel data signal in response to the serial data signal, wherein each of the delay circuits comprises:

an input stage to receive the analog input signal;

an output stage to provide the analog signal tap associated with the delay circuit substantially comprising a version of the analog input signal delayed according to the group delay; and an intermediate stage comprising a capacitor to impart at least a portion of the group delay to the analog signal tap, a buffer circuit coupled between the capacitor and the input stage to substantially remove at least a portion of a capacitive load at an input to the intermediate stage, a first capacitor coupled to the first differential input terminal through a first buffer circuit, a second capacitor coupled to the second differential input terminal through a second buffer circuit and wherein the differential amplifier comprises a first DC current source, and a differential amplifier to provide a differential output signal to the output stage in response to a differential input signal applied to the first and second differential input terminals;

wherein an input to each intermediate stage of each delay circuit comprises first and second differential input terminals; and wherein the differential amplifier comprises a first DC current source and wherein the first and second buffer circuits each comprises a second DC current source having a magnitude exceeding a magnitude of the first DC current source.

7. The system of claim 6, wherein the system further comprises:

a photodiode capable of being to an optical transmission medium; and a transimpedance amplifier to generate the analog input signal in response to a current from the photodiode.

8. The system of claim 6, the system further comprising a SONET framer to receive the parallel data signal.

9. The system of claim 8, wherein the system further comprises a switch fabric coupled to the SONET framer.

10. The system of claim 6, the system further comprising an Ethernet MAC to receive the parallel data signal.

11. The system of claim 10, wherein the system further comprises a switch fabric coupled to the Ethernet MAC.

12. The system of claim 10, wherein the system further comprises a XAUI link coupled between the deserializer and the Ethernet MAC.

13. The system of claim 6, wherein at least one of the input stage and the output stage of each delay circuit comprises a differential amplifier.

14. The system of claim 6, wherein at least one of the input stage and the output stage of each delay circuit comprises an emitter follower circuit.

15. The system of claim 14, wherein the system further comprises a multiplexed data bus coupled to the Ethernet MAC.

16. The system of claim 6, wherein each of the first and second buffer circuits comprise an emitter follower circuit.

* * * * *